United States Patent [19]

Davis et al.

[11] 3,812,521

[45] May 21, 1974

[54] BONDING PAD SUBSTRUCTURE FOR INTEGRATED CIRCUITS

[75] Inventors: William Folsom Davis; Wilson David Pace, both of Tempe, Ariz.

[73] Assignee: Motorola Inc., Franklin Park, Ill.

[22] Filed: Feb. 16, 1973

[21] Appl. No.: 333,239

[52] U.S. Cl. .................... 397/48, 357/68

[51] Int. Cl. .................... H01l 5/02

[58] Field of Search .................... 317/235, 234

[56] References Cited

UNITED STATES PATENTS 3,706,130 12/1972 Seelbach et al. .................... 29/584

*Primary Examiner*—Rudolph V. Rolinec

*Assistant Examiner*—E. Wojciechowicz

*Attorney, Agent, or Firm*—Vincent J. Rauner; Victor Meyer

[57] ABSTRACT

A bonding pad substructure in a semiconductor device prevents injection of minority carriers into the substrate during negative overvoltages applied to the bonding pad. An N-type isolated region is provided in a P-type substrate. A P-type region is provided within the N-type region, subtending the metal bonding pad which is on an oxide layer on the substrate. Shorts between the bonding pad and the semiconductor which may occur at defects in the oxide layer are thus limited to the P-type region, and negative overvoltages on the bonding pad reverse bias the PN junction so that deleterious injection of electrons from the N-type region into the substrate cannot occur.

10 Claims, 4 Drawing Figures

BONDING PAD SUBSTRUCTURE FOR INTEGRATED CIRCUITS

BACKGROUND OF THE INVENTION

Integrated circuits may be advantageously utilized in modern automotive electrical systems, for example, in ignition systems or in seat belt interlock systems, affording substantial cost savings. However, the automotive environment has been found to be an exceptionally harsh one for semiconductor circuits in general, and for integrated circuits in particular. As a result, unexpected problems and requirements have arisen in the design of integrated circuits which must perform reliably in automotive electrical systems and in other difficult environments.

A wide range of temperatures may occur in the automotive environment. Further, a wide range of spurious signals typically occur throughout the wiring of an automotive electrical system. For example, relatively low energy spurious signals of either positive or negative polarity having magnitudes of several hundred volts, hereinafter referred to as "noise" signals, typically occur on wiring lines connecting various sensors to input terminals of integrated circuit devices. Such noise signals may cause malfunctions in the operation of prior art integrated circuit devices, or may even cause destruction of them, and further may destroy discrete semiconductor devices such as power transistors controlled by the integrated circuit. Further, discontinuities in the main power lines of an automotive electrical system, such as interruptions in the connection to the 12 volt automobile battery, may cause severe, high-energy transient voltages, hereinafter called "load dump" voltages, of over 100 volts to occur on the main power lines. The load dump transient voltages may destroy the integrated circuit devices of the prior art in the absence of expensive external protective measures.

Prior art integrated circuit bonding pad substructures have included an isolated N-type region beneath and subtending the bonding pad, the N-type region being formed within a P-type substrate. The bonding pad has been formed on an oxide layer on the surface of the substrate and covering the N-type region. During bonding of an external conductive member to the bonding pad, substantial mechanical force is normally exerted against the bonding pad, frequently causing ruptures in the oxide, so electrical shorting between the bonding pad and the N-type region occurs. This prevents the bonding pad from shorting to the substrate. However, if a sufficiently negative noise pulse is applied to the bonding pad through the conductive member to forward bias the PN junction between the P-type substrate and the N-type region, minority carrier electrons are injected, or emitted, into the P-type substrate. Any nearby N-type region which is reverse biased may then act as a collector for the injected electrons, and the resulting current flow may impair circuit operation, especially when the collecting N-type region is part of a flip-flop or memory circuit. The present invention solves such shortcomings of the prior art by providing a bonding pad substructure which does not permit injection of minority carriers into the substrate.

SUMMARY OF THE INVENTION

In view of the foregoing considerations, it is an object of this invention to provide a bonding pad substructure suitable for integrated circuits in high-noise environments.

It is a further object of this invention to provide a bonding pad substructure suitable for integrated circuits in automotive electrical systems.

It is yet another object of this invention to provide in an integrated circuit a bonding pad substructure which avoids injection of minority carriers into the substrate during operation in an automotive electrical system.

Briefly described, the invention provides a bonding pad substructure including a P-type region subtending an overlying bonding pad, the P-type region being formed within an N-type region. The N-type region is formed within the P-type substrate.

DESCRIPTION OF THE INVENTION

Figure 1:
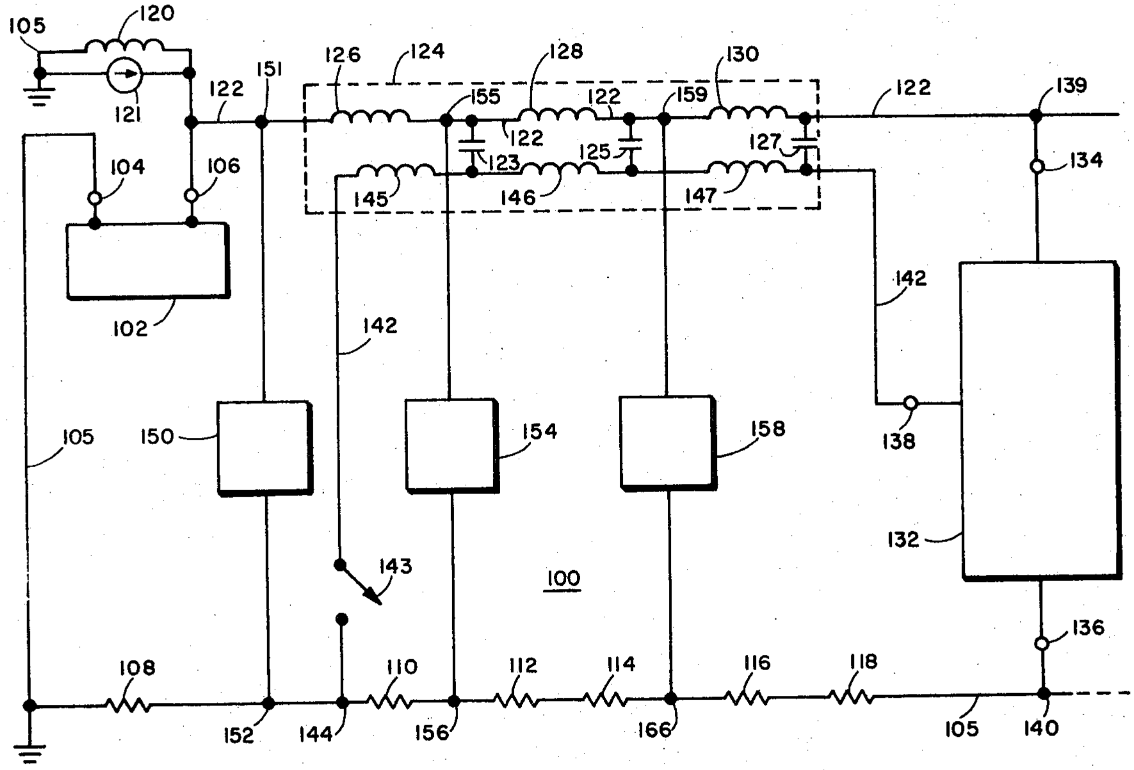
FIG. 1 is a schematic diagram of a model of the automotive electrical environment.

The environment giving rise to the problems solved by the present invention is best described with reference to FIG. 1. In FIG. 1, automotive electrical system 100 includes a 12 volt battery 102, which has a negative terminal 104 and a positive terminal 106. Negative terminal 104 is connected to the electrical ground conductor 105 of the electrical system 100. The electrical ground conductor 105 includes the automobile chassis and wires connected to the chassis at various points thereof. In FIG. 1 the chassis resistance is lumped into several discrete resistors 108, 110, 112, 114, 116 and 118. It is known that these resistances may increase in value as corrosion of the chassis occurs and as mechanical conditions weaken various connections in the chassis as the automobile ages. Positive terminal 106 of battery 102 is connected to alternator field coil 120 and the alternator output, represented by current source 121, the other terminals of which are connected to the system ground. Power line 122, hereinafter referred to as the B+ bus, is also connected to positive terminal 106. B+ bus 122 runs through electrical wiring harness 124, along with numerous other wires of the electrical system. The distributed inductance of B+ bus 122 is lumped into several inductances 126, 128 and 130 in the model of FIG. 1. Integrated circuit 132, which has positive power supply terminal 134, ground supply terminal 136, and input terminal 138 is connected between B+ bus 122 at point 139 thereof and ground conductor 105 at point 140 thereof. Input terminal 138 is connected to wire 142 which runs through wiring harness 124 in close proximity to B+ bus 122 and is connected to switch 143. when switch 143 is closed, wire 142 is connected to ground conductor 105 at point 144 thereof. The distributed inductance of wire 142 is lumped into several inductors 145, 146 and 147. Lumped capacitors 123, 125, and 127 represent the capacitive coupling between B+ bus 122 and signal wire 142. Electrical accessory 150 is connected between point 151 of B+ bus 122 and point 152 of ground conductor 105. Second electrical accessory 154, which may, for example, be an air conditioner motor, is connected between point 155 of B+ bus 122 and point 156 of ground conductor 105. Third electrical accessory 158, which may, for example, be a motor operating an electric seat or electric window, is connected between point 159 of B+ conductor 122 and point 160 of ground conductor 105. The various inductances and capacitances illustrated in FIG. 1 and the coupling therebetween gives rise to a large amount of electrical noise on wire 142 and B+ bus 122 as various electrical accessories are switched on and off. For example, if accessory 158 is operating, a large current flows from terminal 106 through B+ bus 122, inductors 126 and 128 and through resistors 114, 112, 110 and 108 to negative terminal 104. The resistances in ground conductor 105 are typically of sufficiently large value to cause a substantial drop in the ground voltage between point 160 and negative terminal 104. If accessory 158 is suddenly switched off, the change in current through inductors 126 and 128 causes a very large positive transient voltage to appear on point 159 and, also on point 139. Subsequently, a large positive voltage will appear between terminals 134 and 136 of integrated circuit 132. Further, mutual coupling between inductors 126 and 145 and also between inductors 128 and 146 will cause a large positive transient pulse to appear on wire 142 and hence on terminal 138 of integrated circuit 132, especially if switch 143 is open. Similarly, switching the other electrical accessories 150 and 154 on or off may cause positive or negative transient impulses to appear on B+ bus 122, and on terminal 134, and also on wire 142 and terminal 138. In general, it may be seen that any integrated circuit in the electrical system 100 cOnnected distant from battery 102 between B+ bus 122 and ground conductor 105 will experience transient voltages to occur between terminals 134 and 136 when accessories are switched. It is also seen that there will be an uncertain ground reference voltage, due to currents flowing through the distributed resistances 108, 110, etc. Further, any input terminals connected to wires which run through the wiring harness 124 will pick up noise due to mutual inductive and capacitive coupling with B+ bus 122. Another type of noise distinct from that described may occur if the battery is disconnected from the positive terminal 106 while current is flowing through field coil 120. In this case, a high energy, positive transient voltage, called the "load dump" voltage, appears on B+ bus 122.

Figure 2:
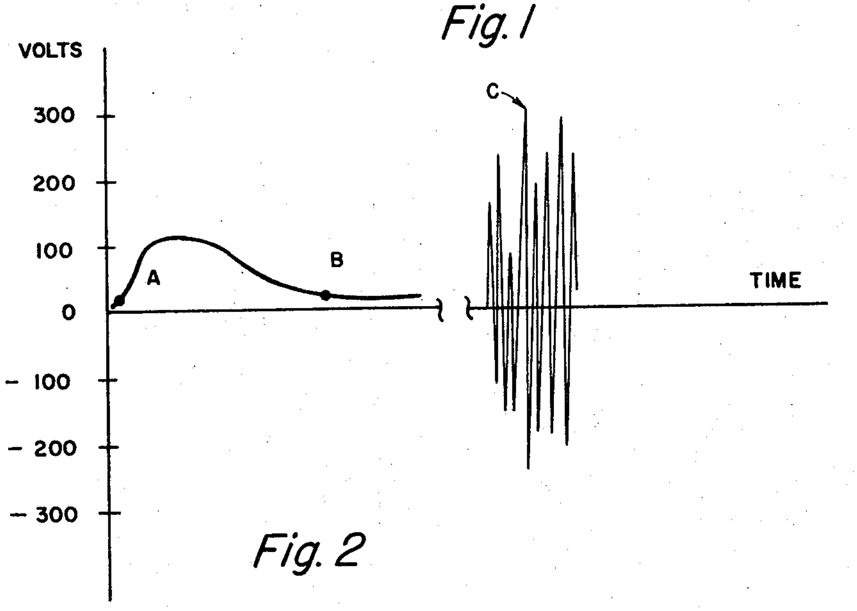
FIG. 2 is a graph illustrating a load dump transient and electrical noise in an automotive electrical system.

Both of the aforementioned types of voltage are illustrated in the graph of FIG. 2. The load dump voltage is illustrated on the left-hand portion of the horizontal axis between points A and B. As seen in FIG. 2, the magnitude of the load dump voltage may exceed 100 volts. The time duration between points A and B is typically half a second. This transient voltage on the B+ bus 122 is sufficient magnitude and energy to destroy prior art integrated circuit devices and low cost discrete semiconductor components such as power transistors unless some method is employed to protect the integrated circuit. The waveform C illustrated on righthand portion of the graph in FIG. 2 represents high voltage, high frequency noise which may occur on B+ bus 122 and wire 142. The magnitude of the noise represented by waveform C may exceed 300 volts, and typically has a duration of approximately 1 to 50 microseconds. These pulses also have energy sufficient to sometimes destroy prior art integrated circuit devices. A spectrum analysis of a noise waveform such as is shown in FIG. 2 further illustrates the presence of very high frequency component signals having magnitudes of several volts and frequencies as high as 100 megahertz. Since bipolar integrated circuits are generally high frequency circuits, they respond to such high frequency noise readily, and various precautions in the design of circuits for use in the automotive environment must be taken to insure that the circuits respond to information input rather than to such noise. Due to the high currents, which may be many amperes, which may flow through the chassis resistance, substantial voltage drops may occur in the ground conductor giving rise to a situation wherein a switch or sensor is referenced to a different ground voltage than the integrated circuit having an input terminal connected by a long wire to the switch or sensor.

Figure 3:
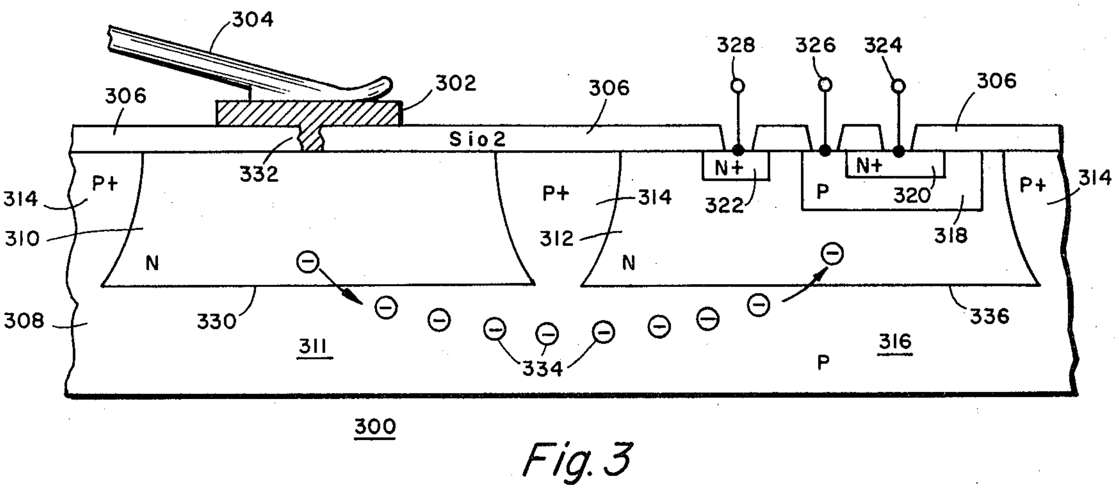
FIG. 3 is a cross sectional diagram including a prior art bonding pad substructure and a nearby transistor, and is useful in describing the problems solved by the invention.

The present invention is directed to solving the problems associated with prior art bonding pad substructures in integrated circuits which must operate in the aforedescribed automotive electrical environment. FIG. 3 illustrates a prior art bonding pad substructure and the major problem associated therewith. In FIG. 3, integrated circuit 300 has a metal bonding pad 302 bonded to a wire lead 304. The bonding pad is on $SiO_2$ layer 306, which is formed on the surface of P-type substrate 308. It should be noted that bonding pad 302 is connected to other circuitry (not shown) in integrated circuit 300. For example, the same metallization that forms bonding pad 302 may include a relatively narrow strip of metal continuous with bonding pad 302 and running along the surface of $SiO_2$ layer 306 for a distance and contacting an electrode of a transistor (not shown) in integrated circuit 300 through a preohmic opening in $SiO_2$ layer 306. N-type region 310 is formed within substrate 308 and provides the bonding pad substructure 311. N-type region 312 is also formed in substrate 308, and both N-type regions 310 and 312 are elctrically isolated by heavily doped P-type isolation regions 314. N-type region 312 forms the collector region of flip-flop transistor 316. P-type base region 318 is formed within region 312, and heavily doped N-type emitter region 320 is formed within region 318. Heavily doped N-type collector contact region 322 is formed within N-type region 312, and the emitter, base and collector of flip-flop transistor 316 are connected to other circuitry (not shown) of the flip-flop by means of conductors 324, 326 and 328, which are connected respectively, to emitter 320, base 318 and collector contact region 322 through openings in silicon dioxide layer 306.

It should be noted that the reason for providing the N-type region 310 for the bonding pad substructure of FIG. 3 is that region 310 prevents bonding pad 302 from being shorted to substrate 308 if a defect such as defect 322 occurs in $SiO_2$ layer 306. Clearly, if bonding pad 302 is shorted to substrate 308, circuit 300 will be unoperative. However, if bonding pad 302 is shorted to region 310 instead, then during normal operation, PN junction 330 is merely reverse biased, and the circuit is operable.

The major problem associated with the bonding pad substructure 311 is that when the voltage applied to wire lead 304 is sufficiently negative to forward bias PN junction 330, formed by substrate 308 and N-type region 310, then any defect, beneath the bonding pad, such as defect 332 in $SiO_2$ layer 306, shorts the bonding pad 302 to N-type region 310 causing minority carrier electrons 334 to be injected into substrate 308. Defects such as defect 332 frequently occur beneath the bonding pads of an integrated circuit because of the high mechanical force applied to the bonding pad during the bonding of wire lead 304 thereto. If transistor 317 is one of the cross coupled switching transistors of a flip-flop on integrated circuit 300, and the flip-flop has positive voltage on conductor 328, then PN junction 336, formed by substrate 308 and N-type region 312, is reverse biased, and region 312 will collect some of the injected minority carriers 334. If a sufficiently negative noise pulse appears on bonding lead 304, enough carriers may be injected and collected to change the stored logical state of the flip-flop of which transistor 316 is a switching transistor.

Figure 4:
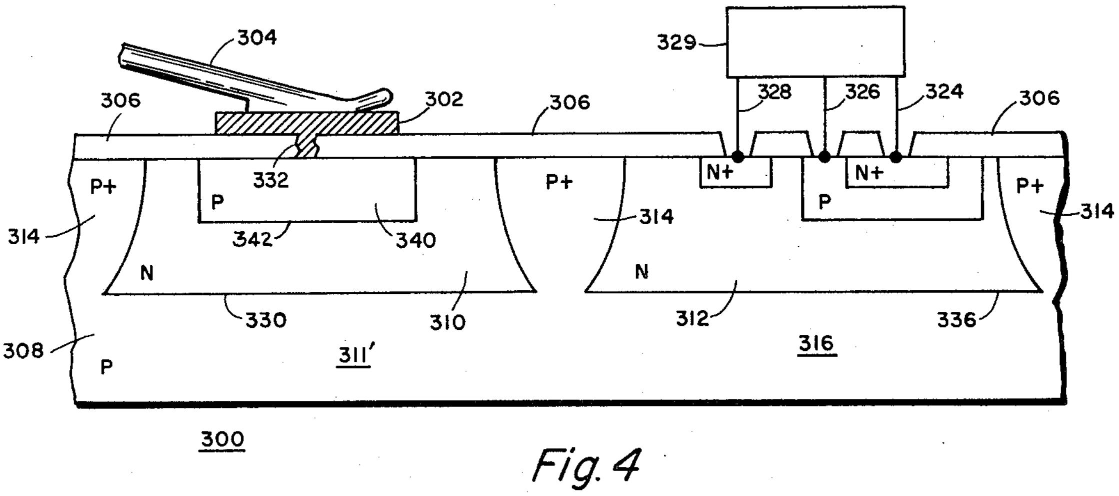
FIG. 4 is a cross sectional diagram of an embodiment of the invention.

FIG. 4 is a diagram of an embodiment of the invention. FIG 4 is identical to FIG. 3, except for the addition of P-type region 340 and of flip-flop circuitry 329, represented in block diagram form. P-type region 340 if formed within N-type region 310, and subtends bonding pad 302, forming the improved bonding pad substructure 311', so that any defect in $SiO_2$ layer 306 beneath bonding pad 302 can only cause a short to P-type region 340, but not to N-type region 310. Additional flip-flop circuitry 329 is connected to switching transistor 316 by means of conductors 324, 326 and 328 previously described. Thus, it is seen from FIG. 4 that if bonding pad 302 is shorted to underlying semiconductor material of P-type region 340 through oxide defect 332 then PN junction 342, formed by regions 310 and 340, will be reverse biased when large negative noise voltages appear on conductive wire 304. Thus, N-type region 310 is not forward biased, and no injection of electrons into substrate 308 occurs. Therefore, flip-flop transistor 316 and consequently flip-flop circuitry 329 remain undisturbed by the noise signal.

Hence, it is seen that an integrated circuit having the improved bonding pad substructure 311' as described with respect to FIG. 4 may operate reliably in the high-noise automotive environment as described previously with respect to FIGS. 1 and 2. For example, integrated circuit 300 in FIG. 4 may be integrated circuit 132 in FIG. 1, and input terminal 138 in FIG. 1 may be wire lead 304 in FIG. 4. Then, large negative overvoltages on wire 142 (FIG. 1) will not cause injection of electrons into the substrate 308, and the stored logical state of the flip-flop formed by transistor 316 and additional flip-flop circuitry 329 will not be disturbed.

The invention described herein provides a bonding pad substructure which, although it adds essentially no cost to the integrated circuit, is a solution to the aforedescribed problem of injection of minority carriers into the substrate, which in turn has not been a serious problem in integrated circuits prior to their use in the harsh automotive environment.

Although this invention has been illustrated and described in relation to several specific embodiments thereof, those skilled in the art will readily recognize that variations in placement of parts may be made to suit specific requirements without departing from the spirit and scope of the invention.

What is claimed is:

1. A bonding pad substructure in a semiconductor device comprising:
   a relatively uniformly doped semiconductor substrate of a single first conductivity type, having a surface;
   a first region of a second conductivity type within said semiconductor substrate at said surface, said substrate also having a second region of said second conductivity type therein at said surface;
   an isolation region of said first conductivity type electrically isolating said first region from said second region;
   a third region of said first conductivity type within said first region at said surface;
   a first insulating layer on said surface covering said first region; and
   a metal bonding pad on said insulating layer over said third region, said metal bonding pad being insulated from said third region, said metal bonding pad being subtended by said third region.

2. The bonding pad substructure as recited in claim 1 wherein said first insulating layer is silicon dioxide.

3. The bonding pad substructure recited in claim 1 wherein an external segment of bonding wire is bonded to said metal bonding pad.

4. The bonding pad substructure as recited in claim 1 wherein said first conductivity type is P-type and said second conductivity type is N-type.

5. The bonding pad substructure as recited in claim 1 wherein said second region is the collector of an NPN transistor of a storage circuit.

6. In a semiconductor device, a bonding pad substructure comprising:
   a relatively uniformly doped P-type semiconductor substrate having a surface thereon;
   a first N-type region in said P-type semiconductor substrate at said surface, said P-type semiconductor substrate also having a second N-type region therein at said surface;
   a P-type isolation region in said P-type semiconductor substrate isolating said first and second N-type regions;
   a P-type region within said first N-type region at said surface;
   a silicon dioxide layer on said surface of said P-type semiconductor substrate covering said first N-type region in said P-type region;
   a metal bonding pad on said silicon dioxide layer insulated from said P-type region, said metal bonding pad being subtended by said P-type region and having an external segment of bonding wire bonded thereto, wherein if said metal bonding pad is shorted to said P-type region through a defect in said silicon dioxide layer, no minority carriers are injected into said P-type semiconductor substrate from said first N-type region and collected by said second N-type region when a negative voltage pulse is applied to said metal bonding pad.

7. The bonding pad substructure as recited in claim 6 wherein said P-type semiconductor substrate is silicon.

8. The bonding pad substructure as recited in claim 6 wherein said metal bonding pad is aluminum.

9. The bonding pad substructure as recited in claim 6 wherein said metal bonding pad is an aluminum compound.

10. An integrated circuit for use in an automotive electrical system including a relatively uniformly doped P-type semiconductor substrate having a surface thereon, a first N-type region in said P-type semiconductor substrate at said surface, said P-type semiconductor substrate also having a second N-type region therein at said surface, the P-type isolation region in said P-type semiconductor substrate isolating said first and second N-type regions, a silicon dioxide layer on said surface of said P-type semiconductor substrate covering said first N-type region, and a metal bonding pad on said silicon dioxide layer having an external segment of bonding wire bonded thereto, the improvement comprising:

a P-type region within said first N-type region at said surface, said metal bonding pad being subtended by said P-type region, said metal bonding pad being insulated from said P-type region, wherein if said metal bonding pad is shorted to said P-type region through a defect in said silicon dioxide layer, no minority carriers are injected into said P-type semiconductor substrate from said first N-type region and collected by said second N-type region when a negative noise impulse in said automotive electronic system is coupled to said metal bonding pad.

* * * * *